United States Patent [19]

Yamaguchi

[11] Patent Number: 4,908,794
[45] Date of Patent: Mar. 13, 1990

[54] SEMICONDUCTOR MEMORY DEVICE WITH IMPROVED OUTPUT CIRCUIT

[75] Inventor: Takashi Yamaguchi, Tokyo, Japan

[73] Assignee: NEC Corporation, Tokyo, Japan

[21] Appl. No.: 271,986

[22] Filed: Nov. 16, 1988

[30] Foreign Application Priority Data

Nov. 16, 1987 [JP] Japan .................................. 62-289915

[51] Int. Cl.[4] ........................ G11C 11/40; G11C 7/00
[52] U.S. Cl. .............................. 365/189.08; 365/207;
365/208; 365/189.05; 307/445; 307/446
[58] Field of Search ...................... 365/189.05, 189.08,
365/190, 207, 208; 307/445, 446, 495

[56] References Cited

U.S. PATENT DOCUMENTS

| | | | |
|---|---|---|---|
| 4,527,081 | 7/1985 | Stewart | 365/189.05 X |
| 4,604,731 | 8/1986 | Konishi | 365/189.08 X |
| 4,774,690 | 9/1988 | Watanabe et al. | 365/189.08 X |
| 4,807,198 | 2/1989 | Flannagan et al. | 365/190 X |

Primary Examiner—Stuart N. Hecker
Assistant Examiner—Alyssa H. Bowler
Attorney, Agent, or Firm—Sughrue, Mion, Zinn, Macpeak & Seas

[57] ABSTRACT

A semiconductor memory device according to the present invention has a memory cell array and an output circuit provided in association with a pair of data lines which comprises a series combination of a main sense amplifier circuit and a first NOR gate, a series combination of an auxiliary sense amplifier circuit and a second NOR gate, and an output inverter circuit, and the two series combinations produces a data bit signal and the inverse thereof for driving the output inverter circuit, so that a time period consumed for a read-out operation is constant regardless of the logic level of a data bit read out from the memory cell.

5 Claims, 5 Drawing Sheets

PRIOR-ART

PRIOR-ART

SEMICONDUCTOR MEMORY DEVICE WITH IMPROVED OUTPUT CIRCUIT

FIELD OF THE INVENTION

This invention relates to a semiconductor memory device and, more particularly, to an output circuit incorporated in the semiconductor memory device.

BACKGROUND OF THE INVENTION

A typical example of the output circuit is illustrated in FIG. 1. The output circuit 1 is provided in association with a memory cell array ( not shown ) arranged in rows and columns, and memory cells in each column are coupled to a pair of bit lines. Though not shown in the drawings, a column selector circuit is provided for select one of the bit line pairs, so that a complementary signal appears on a pair of data line 2 and 3 in accordance with a data bit read out from the memory cell accessed. A sense amplifier circuit 4 of the current mirror type is coupled to the data lines 2 and 3, and the sense amplifier circuit 4 comprises two series combinations of p-channel type field effect transistors 5 and 6 and n-channel type field effect transistors 7 and 8 coupled in parallel to a source of voltage level Vdd, and an n-channel type field effect transistor 9 coupled between the two series combinations and a ground terminal for activation of the sense amplifier circuit 4 in the presence of an activation signal SE. The sense amplifier circuit 4 thus arranged is operative to amplify the complementary signal on the data lines 2 and 3 in response to the activation signal SE for producing a data bit signal DB at an output node thereof 10.

The output circuit 1 further comprises a NOR gate 11, an inverter circuit 12 coupled in parallel to the output node 10 of the sense amplifier circuit 4, a NOR gate 13 coupled to the inverter circuit 12, and an output inverter circuit 14 driven by the NOR gates 11 and 13. The NOR gate 11 has a series combination of two p-channel type field effect transistors 15 and 16 and an n-channel type field effect transistor 17 coupled between the source of voltage level Vdd and the ground terminal and an n-channel type field effect transistor 18 coupled in parallel to the n-channel type field effect transistor 17, and the p-channel type field effect transistor 15 and the n-channel type field effect transistor 18 are provided for activation of a complementary inverter circuit formed by the p-channel type and n-channel type field effect transistors 16 and 17 in the presence of an output enable signal OE. The inverter circuit 12 is provided with a series combination of a p-channel type field effect transistor 19 and an n-channel type field effect transistor 20, and the NOR gate 13 is similar in circuit arrangement to the NOR gate 11. Namely, the NOR gate 13 has a series combination of two p-channel type field effect transistors 21 and 22 and an n-channel type field effect transistor 23 coupled between the source of voltage level Vdd and the ground terminal and an n-channel type field effect transistor 24 coupled in parallel to the n-channel type field effect transistor 23, and the p-channel type field effect transistor 21 and the n-channel type field effect transistor 24 are also provided for activation of a complementary inverter circuit formed by the p-channel type and n-channel type field effect transistors 22 and 23 in the presence of the output enable signal OE. The output inverter circuit 14 is provided with a series combination of an n-p-n type bipolar transistor 25 and an n-channel type field effect transistor 26 coupled between the source of voltage level Vdd and the ground terminal, and the n-p-n type bipolar transistor 25 and the n-channel type field effect transistor 26 are driven by the NOR gates 11 and 13, respectively. An output node is provided between the n-p-n type bipolar transistor 25 and the n-channel type field effect transistor 26 and coupled to a data output terminal 27.

Description is hereinunder made for read-out operations on the assumption that the memory cells respectively storing the logic "1" bit and the logic "0" bit are accessed in succession. At time t1 of FIG. 2, the complementary signal is supplied from the memory cell to the data lines 2 and 3 through the selector circuit, so that the data line 2 goes down to the low voltage level, but the data line 3 goes up to the high voltage level in accordance with the logic "1" bit stored in the memory cell. Since the data line 2 affects the logic level of the data bit signal DB, the data bit signal DB goes down to the low voltage level at time t2. With the output enable signal OE of the active low voltage level, the NOR gates 11 and 13 are activated to form the inverses at the output nodes thereof, respectively. However, the data bit signal DB is directly supplied to the NOR gate 11 but is supplied to the NOR gate 13 after inversion carried out by the inverter circuit 12. Then, the inverter circuit 12 and the NOR gate 11 simultaneously shift the output nodes thereof to the high voltage level at time t3, but the NOR gate 13 shifts the output node thereof to the low voltage level at time t4. However, the n-p-n type bipolar transistor 25 is activated by the NOR gate 11 at time t3, so that the data output terminal 27 is determined in voltage level around time t4.

Subsequently, the memory cell storing the logic "0" bit is accessed, and the complementary signal is supplied from the memory cell to the data lines 2 and 3 through the selector circuit, so that the data line 2 goes up to the high voltage level, but the data line 3 goes down to the low voltage level at time t5. At time t6, the data bit signal DB goes up to the low voltage level, and the NOR gates 11 and 13 are activated with the output enable signal OE of the active low voltage level. Then, the inverter circuit 12 and the NOR gate 11 simultaneously shift the output nodes thereof to the low voltage level at time t7, but the NOR gate 13 shifts the output node thereof to the high voltage level at time t8. Thus, the NOR gates 11 and 13 are completed the functions thereof at time t8, however, the output inverter circuit 14 needs to discharge the data output terminal 27 to shift the voltage level thereat. Then, the output terminal 27 is determined in voltage level at time t9.

A problem is encountered in the prior-art output circuit 1 in that a prolonged time period is consumed from the alternation of the complementary data signal on the data lines 2 and 3 to completion of the read-out operation. This is because of the fact that the inverter circuit 12 is provided between the sense amplifier circuit 4 and the NOR gate 13. In detail, if the memory cell storing the logic "1" bit is accessed, the delayed time period is approximately equal to the total sum of the respective time periods for amplifying the complementary data signal at the sense amplifier circuit 4, producing the inverse of the data bit signal DB at the NOR gate 11 and driving the data output terminal 27 by the output inverter circuit 14. However, the delayed time period is prolonged upon read-out operation from the memory cell storing the logic "0" bit due to the inverter circuit 12. Then, the semiconductor memory device should be adjusted to the longest time period consumed for the read-out operation regardless of the logic level of the data bit.

SUMMARY OF THE INVENTION

It is therefore an important object of the present invention to provide a semiconductor memory device which consumes a relatively short time period for read-out operation.

To accomplish these objects, the present invention proposes to provide an auxiliary sense amplifier circuit in parallel to the main sense amplifier circuit.

In accordance with the present invention, there is provided a semiconductor memory device having a plurality of memory cells arranged in rows and columns, a data bit read out from one of the memory cells being supplied to a pair of data lines, comprising: (a) a first sense amplifier circuit coupled to the data lines and operative to increase a difference in voltage level between the data lines for producing a data bit signal; (b) a first NOR gate activated by an output enable signal and coupled at an input node thereof to the first sense amplifier circuit for producing an inverted signal of the data bit signal; (c) a second sense amplifier circuit coupled to the data lines and operative to increase the difference in voltage level on the data lines for producing the inverse of the data bit signal; (d) a second NOR gate activated by the output enable signal and coupled at an input node thereof to the second sense amplifier circuit for producing a non-inverted signal of the data bit signal; and (e) an output inverter circuit responsive to the inverted signal and the non-inverted signal for producing an output data signal.

BRIEF DESCRIPTION OF THE DRAWINGS

The features and advantages of a semiconductor memory device according to the present invention will be more clearly understood from the following description taken in conjunction with the accompanying drawings in which.

DESCRIPTION OF THE PREFERRED EMBODIMENTS

First embodiment

Figure 1:
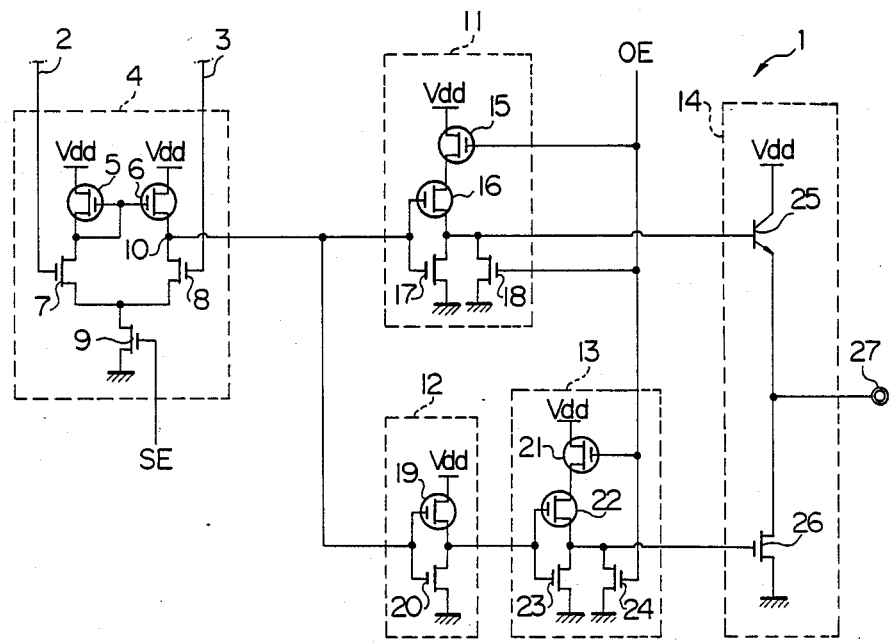
FIG. 1 is a diagram showing the circuit diagram of a prior-art output circuit incorporated in a semiconductor memory device.
Figure 2:
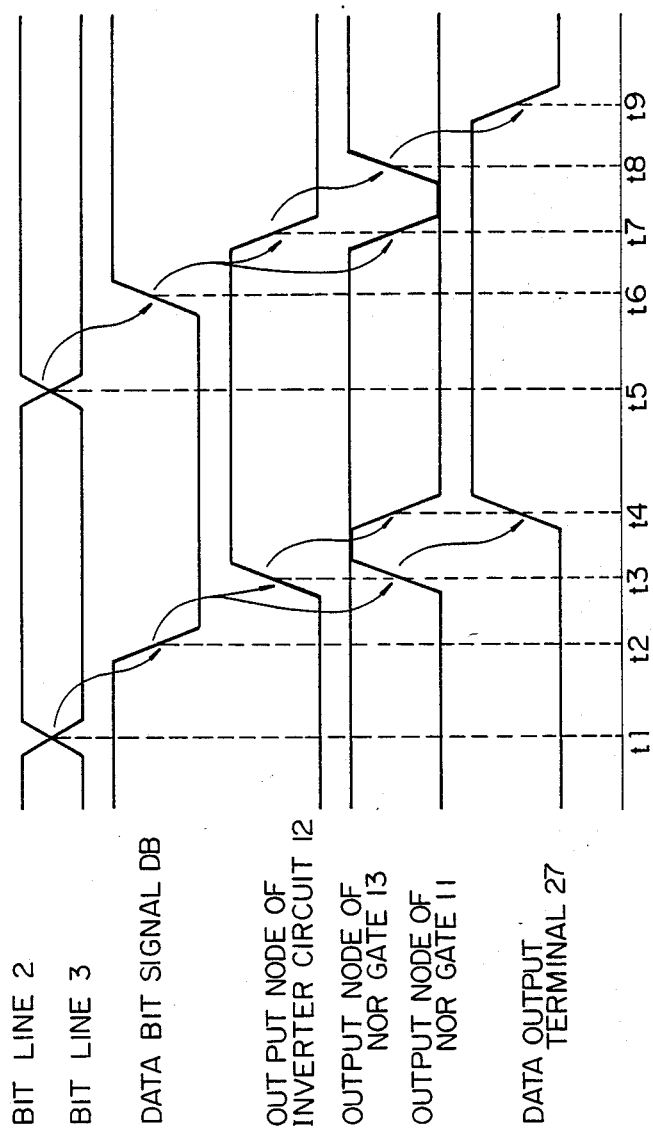
FIG. 2 is a diagram showing the waveforms for describing the read out operations of the output circuit shown in FIG. 1.
Figure 3:
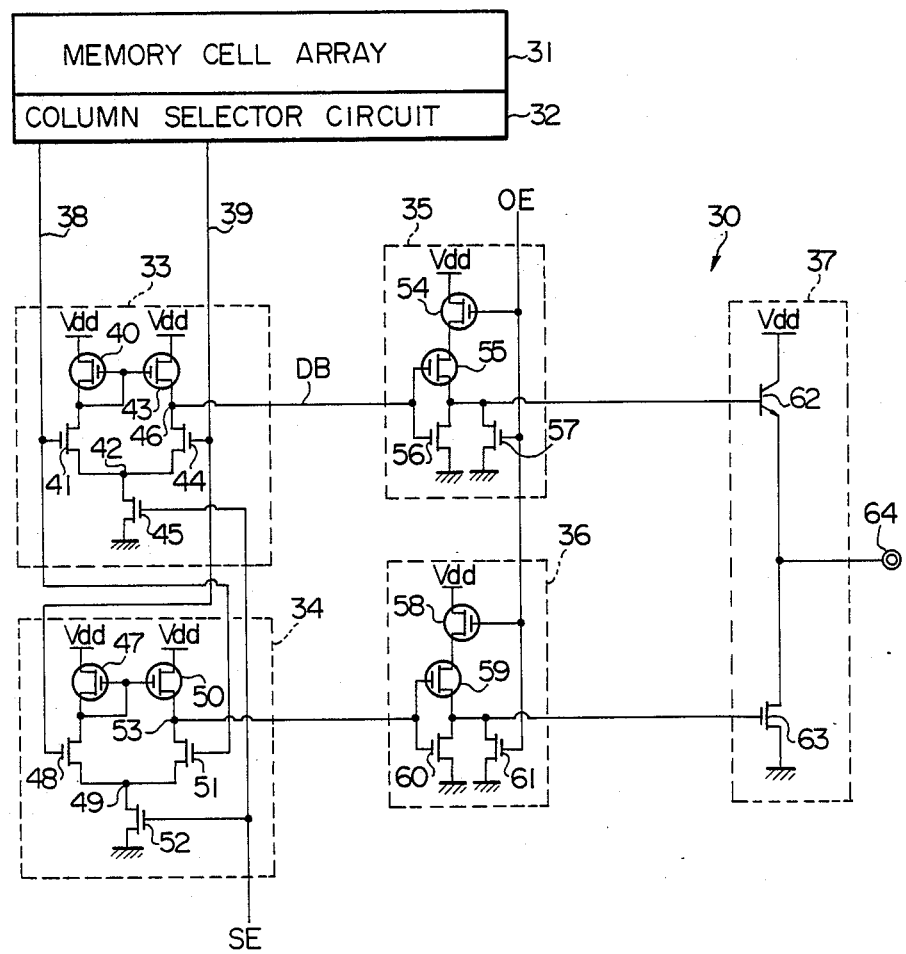
FIG. 3 is a diagram showing the circuit arrangement of an output circuit incorporated in a semiconductor memory device according to the present invention.

Referring first to FIG. 3 of the drawings, there is shown an output circuit 30 incorporated in a semiconductor memory device fabricated on a semiconductor chip. The output circuit 30 is provided in association with the memory cell array 31, and a column selector circuit 32 is provided between the memory cell array 31 and the output circuit 30. Each of the memory cells of the array 31 stores a data bit of either logic "1" or "0" level, and the data bit is transferred from memory cell to the column selector circuit 32 when accessed. The output circuit 30 largely comprises a first sense amplifier circuit 33, a second sense amplifier circuit 34 provided in parallel to the first sense amplifier circuit 33, a first NOR gate 35 coupled to the first sense amplifier circuit, a second NOR gate 36 coupled to the second sense amplifier circuit 34, and an output inverter circuit 37 driven by the NOR gates 35 and 36. A pair of data lines 38 and 39 extend in parallel from the column selector circuit 32 for propagation of a complementary bit signal corresponding to the data bit, so that a difference in voltage level takes place between the data lines 38 and 39 depending upon the logic level of the data bit.

The first sense amplifier circuit 33 is of the current mirror type and comprises a series combination of a p-channel type field effect 40 and an n-channel type field effect transistor 41 coupled between a source of positive voltage level Vdd and an activation node 42, a series combination of a p-channel type field effect transistor 43 and an n-channel type field effect transistor 44 coupled between the source of positive voltage level Vdd and the activation node 42, and an n-channel type field effect transistor 45 coupled between the activation node 42 and a ground terminal. The p-channel type field effect transistors 40 and 43 have respective gate electrodes coupled to a common drain node of the transistors 40 and 41, but the n-channel type field effect transistors 41 and 44 have respective gate electrodes coupled to the data lines 38 and 39, respectively. The n-channel type field effect transistor 45 is responsive to an activation signal SE for coupling the activation node 42 to the ground terminal, then the first sense amplifier circuit 33 is activated to increase the difference in voltage level between the data lines 38 and 39, thereby producing a data bit signal DB at a common drain node 46 of the transistors 43 and 44.

The second sense amplifier circuit 34 is similar in construction to the first sense amplifier circuit 33 but coupled to the data lines 38 and 39 in the inverted manner. Namely, the second sense amplifier circuit 34 comprises a series combination of a p-channel type field effect 47 and an n-channel type field effect transistor 48 coupled between the source of positive voltage level Vdd and an activation node 49, a series combination of a p-channel type field effect transistor 50 and an n-channel type field effect transistor 51 coupled between the source of positive voltage level Vdd and the activation node 49, and an n-channel type field effect transistor 52 coupled between the activation node 49 and the ground terminal The p-channel type field effect transistors 47 and 50 have respective gate electrodes coupled to a common drain node of the transistors 47 and 48, but the n-channel type field effect transistors 48 and 51 have respective gate electrodes coupled to the data lines 39 and 38, respectively. The second sense amplifier circuit 34 thus arranged produces the inverse of the data bit signal DB at a common node 53 of the transistors 43 and 44 in the presence of the activation signal SE.

The first NOR gate 35 has a series combination of two p-channel type field effect transistors 54 and 55 and an n-channel type field effect transistor 56 coupled between the source of positive voltage level Vdd and the ground terminal and an n-channel type field effect transistor 57 coupled in parallel to the n-channel type field effect transistor 56, and the p-channel type field effect transistor 54 and the n-channel type field effect transistor 57 are provided for activation of a complementary inverter circuit formed by the p-channel type and n-channel type field effect transistors 55 and 56 in the presence of an output enable signal OE. The second NOR gate 36 is similar in circuit arrangement to the first NOR gate 35, so that reference numerals 58, 59, 60 and 61 are used for designating the component transistors corresponding to the transistors 54 to 57. The first and second NOR gates 35 and 36 thus arranged are operative to produce an inverted signal of the data bit signal and a non-inverted signal of the data bit signal, respectively, in the presence of the output enable signal OE.

The output inverter circuit 37 is provided with a series combination of an n-p-n type bipolar transistor 62 and an n-channel type field effect transistor 63 coupled between the source of positive voltage level Vdd and the ground terminal, and the n-p-n type bipolar transistor 62 and the n-channel type field effect transistor 63 are driven by the first and second NOR gates 35 and 36, respectively. An output node is provided between the n-p-n type bipolar transistor 62 and the n-channel type field effect transistor 63 and coupled to a data output terminal 64.

Figure 4:
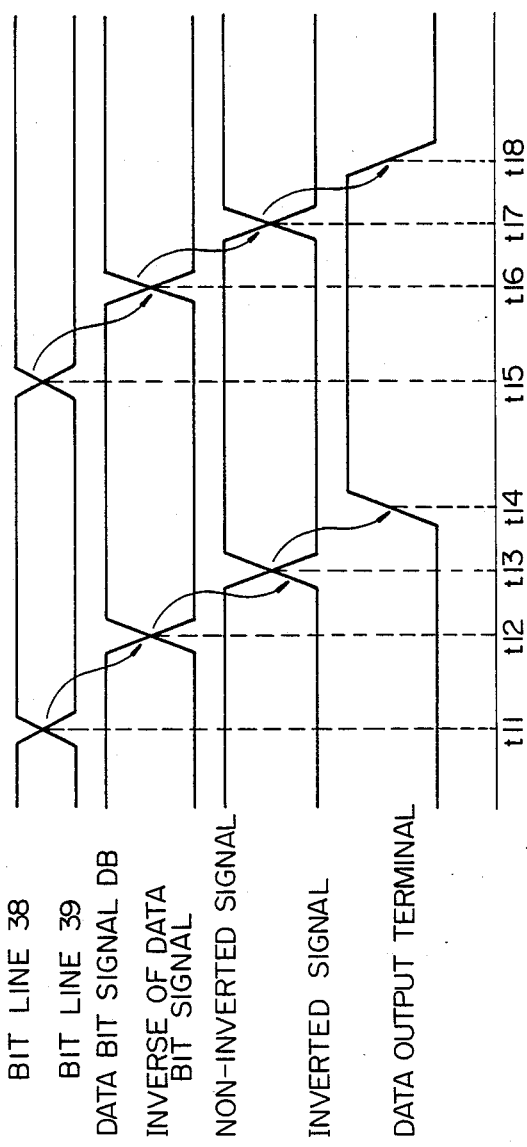
FIG. 4 is a diagram showing the waveforms appearing at essential nodes of the output circuit illustrated in FIG. 3.

Description is hereinunder made for read-out operations with reference to FIG. 4 on the assumption similar to that of the prior-art. At time t11, the complementary bit signal is supplied from the memory cell to the data lines 38 and 39 through the column selector circuit 32, so that the data line 38 goes down to the low voltage level, but the data line 39 goes up to the high voltage level in accordance with the logic "1" bit read out from the memory cell. Since the data line 38 affects the logic level of the data bit signal DB, the data bit signal DB goes down to the low voltage level at time t12. With the output enable signal OE of the active low voltage level, the first and second NOR gates 35 and 36 are activated to respond to the data bit signal DB and the inverse thereof, respectively. The data bit signal DB is in the low voltage level, so that the first NOR gate 35 produces the inverted signal of the high voltage level at time 13, but the second NOR gate 36 simultaneously yields the non-inverted signal of the low voltage level. With the inverted signal of the high voltage level, the n-p-n type bipolar transistor 62 turns on to supply the data output terminal 64 with the positive voltage level, and the n-channel type field effect transistor 63 provides no conduction path between the data output terminal 64 and the ground terminal, thereby shifting the data output terminal 64 to the high voltage level.

Subsequently, the memory cell storing the logic "0" bit is accessed, and the complementary signal is supplied from the memory cell to the data lines 2 and 3, so that the data line 38 goes up to the high voltage level, but the data line 39 goes down to the low voltage level at time t15. Then, the data bit signal DB goes up to the low voltage level, but the inverse is moved in the opposite direction at time t16. With the output enable signal OE of the active low voltage level, the first and second NOR gates 35 and 36 are activated to change the inverted signal and the non-inverted signal, respectively. Then, the first NOR gate 35 shifts the inverted signal to the low voltage level, and the second NOR gate 36 shifts the non-inverted signal to the high voltage level at time t16. Thus, the NOR gates 35 and 36 are simultaneously completed the functions thereof, so that the n-p-n type bipolar transistor 62 turns off to block the current path from the source of positive voltage level Vdd to the data output terminal 64, but a conduction path is established from the data output terminal 64 to the ground terminal at time t18, thereby shifting the data output terminal to the low voltage level.

The output circuit according to the present invention simultaneously produces the data bit signal DB and the inverse thereof, so that the delayed time period is approximately equal to the total sum of the respective time periods consumed by the sense amplifier circuit, the NOR gate and the output inverter circuit 37 by virtue of dualizing the signal flow from the data lines 38 and 39 to the data output inverter circuit 37. As a result, the delayed time period can be adjusted to the shortest time period regardless of the logic level of the data bit read out from the memory cell.

Second embodiment

Figure 5:
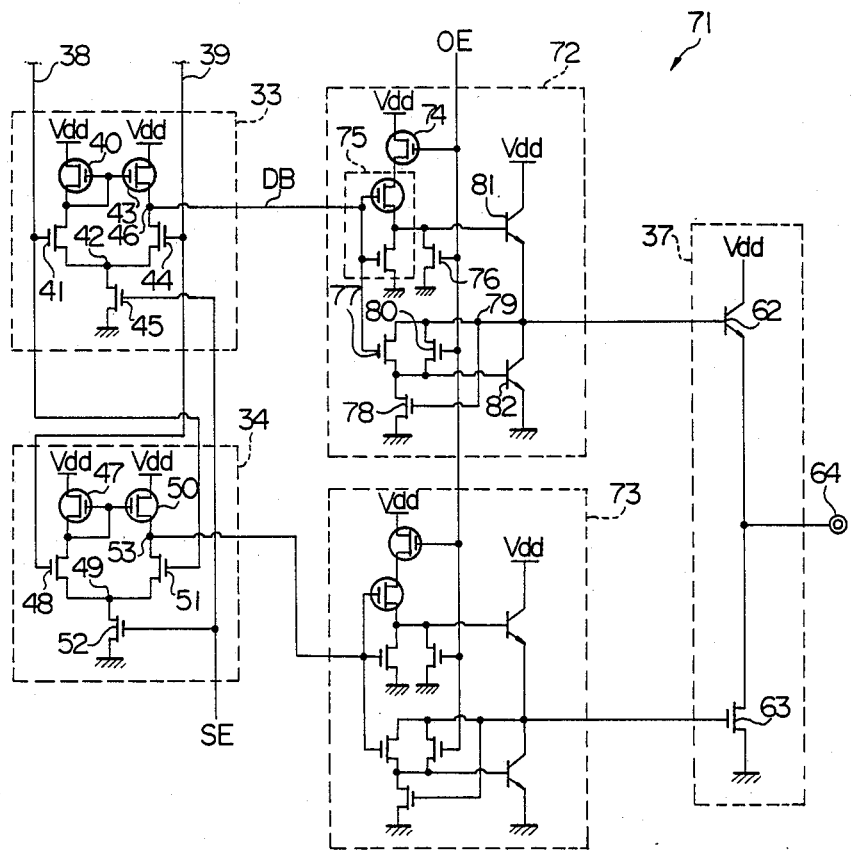
FIG. 5 is a diagram showing the circuit arrangement of another output circuit embodying the present invention.

Turning to FIG. 5 of the drawings, there is shown the circuit arrangement of another output circuit 71 embodying the present invention. The output circuit 71 is similar in circuit arrangement to the output circuit 30 except for first and second NOR gates 72 and 73, so that like reference numerals are used for designating circuits and component transistors corresponding to those of the output circuit 30, but no further description will be incorporated.

The first and second NOR gates 72 and 73 are similar in circuit arrangement to each other, and, for this reason, description is made for the first NOR gate 72 only. The first NOR gate 72 comprises a series combination of a first p-channel type field effect transistor 74 and a complementary inverter circuit 75 coupled between the source of positive voltage level Vdd and the ground terminal, a first n-channel type field effect transistor 76 coupled between a common drain node of the complementary inverter circuit 75 and the ground terminal, a series combination of second and third n-channel type field effect transistors 77 and 78 coupled between an output node 79 and the ground terminal, a fourth n-channel type field effect transistor 80 coupled in parallel to the n-channel type field effect transistor 77, and a series combination of first and second n-p-n type bipolar transistors 81 and 82 coupled between the source of positive voltage level Vdd and the ground terminal. The complementary inverter circuit 75 and the second n-channel type field effect transistor 77 have respective gate electrodes coupled to the common drain node 46, and the first p-channel type field effect transistor 74, and the first and fourth n-channel type field effect transistors 76 and 80 are supplied at respective gate electrodes with the output enable signal OE. Moreover, the third n-channel type field effect transistor 78 is coupled at the gate electrode thereof to the output node 79, and the first and second n-p-n bipolar transistors 81 and 82 are coupled at the base electrodes thereof to a common drain node of the complementary inverter circuit 75 and a common drain node between the second and third n-channel type field effect transistors 77 and 78, respectively. The NOR gate 72 thus arranged is activated in the presence of the output enable signal OE of the active low voltage level and produces the inverted signal of the data bit signal DB. The n-p-n type bipolar transistors 81 and 82 are larger in current driving capability than the field effect transistors, so that the data output terminal 64 is shifted in voltage level at an improved speed with respect to the output circuit 30.

Although particular embodiments of the present invention have been shown and described, it will be obvious to those skilled in the art that various changes and modifications may be made without departing from the spirit and scope of the present invention.

What is claimed is:

1. A semiconductor memory device having a plurality of memory cells arranged in rows and columns, a data bit read out from one of said memory cells being supplied to a pair of data lines, comprising:
   (a) a first sense amplifier circuit coupled to said data lines and operative to increase a difference in voltage level between said data lines for producing a data bit signal;
   (b) a first NOR gate activated by an output enable signal and coupled at an input node thereof to said first sense amplifier circuit for producing an inverted signal of said data bit signal;
   (c) a second sense amplifier circuit coupled to said data lines and operative to increase the difference in voltage level on said data lines for producing the inverse of said data bit signal;
   (d) a second NOR gate activated by said output enable signal and coupled at an input node thereof to said second sense amplifier circuit for producing a non-inverted signal of said data bit signal; and
   (e) an output inverter circuit responsive to said inverted signal and said non-inverted signal for producing an output data signal.

2. A semiconductor memory device as set forth in claim 1, in which each of said first and second NOR gate comprises a series combination of a first p-channel type field effect transistor and a complementary inverter circuit provided between a source of positive voltage and a ground terminal and a first n-channel type field effect transistor coupled between a common drain node of the complementary inverter circuit and the ground terminal, said first p-channel type field effect transistor and said first n-channel type field effect transistor having respective gate electrodes supplied with said output enable signal, said complementary inverter circuit being supplied with each of said data bit signal and the inverse thereof.

3. A semiconductor memory device as set forth in claim 1, in which each of said first and second NOR gates comprises a series combination of a first p-channel type field effect transistor and a complementary inverter circuit coupled between a source of positive voltage level and a ground terminal, a first n-channel type field effect transistor coupled between a common drain node of the complementary inverter circuit and the ground terminal, a series combination of a first n-p-n type bipolar transistor, an output node and a second n-p-n type field effect transistor coupled between the source of positive voltage level and the ground terminal, a series combination of a second n-channel type field effect transistor, a common drain node and a third n-channel type field effect transistor coupled between the output node and the ground terminal, and a fourth n-channel type field effect transistor coupled in parallel to the second n-channel type field effect transistor, said first p-channel type field effect transistor, said first and fourth n-channel type field effect transistors having respective gate electrodes supplied with said output enable signal, said complementary inverter circuit and said second n-channel type field effect transistor being supplied with said data bit signal, said third n-channel type field effect transistor having a gate electrode coupled to said output node, said first and second n-p-n type bipolar transistors having respective base electrodes coupled to common drain nodes of said complementary inverter circuit and said series combination of said second and third n-channel type field effect transistors, respectively, each of said inverted signal and said non-inverted signal being produced at said output node.

4. A semiconductor memory device as set forth in claim 3, in which each of said first and second sense amplifier circuits comprises a first series combination of a second p-channel type field effect transistor and a fifth n-channel type field effect transistor coupled between said source of positive voltage level and an activation node, a second series combination of a third p-channel type field effect transistor and a sixth n-channel type field effect transistor coupled between the source of positive voltage level and the activation node, and a seventh n-channel type field effect transistor coupled between the activation node and said ground terminal, said second and third p-channel type field effect transistors having respective gate electrodes coupled to a common drain node of said first series combination, said fifth and sixth n-channel type field effect transistors having respective gate electrodes coupled to said data lines, respectively, said second series combination having a common drain node where each of said data bit signal and the inverse thereof takes place.

5. A semiconductor memory device as set forth in claim 4, in which said output inverter circuit comprises a series combination of a third n-p-n type bipolar transistor and an eighth n-channel type field effect transistor coupled between said source of positive voltage level and said ground terminal and in which said inverted signal and said non-inverted signal are supplied to a base node of said third n-p-n type bipolar transistor and a gate electrode of said eighth n-channel type field effect transistor, respectively.

* * * * *

UNITED STATES PATENT AND TRADEMARK OFFICE
CERTIFICATE OF CORRECTION

PATENT NO. : 4,908,794

DATED : March 13, 1990

INVENTOR(S) : Yamaguchi

It is certified that error appears in the above-identified patent and that said Letters Patent is hereby corrected as shown below:

Col. 3, line 68, delete ""0="" and insert --"0"--.

Signed and Sealed this

Twentieth Day of August, 1991

Attest:

Attesting Officer

HARRY F. MANBECK, JR.

Commissioner of Patents and Trademarks